United States Patent
Al-Adnani

(10) Patent No.: US 10,371,732 B2
(45) Date of Patent: Aug. 6, 2019

(54) METHOD AND SYSTEM FOR PERFORMING REAL-TIME SPECTRAL ANALYSIS OF NON-STATIONARY SIGNAL

(71) Applicant: Keysight Technologies, Inc., Minneapolis, MN (US)

(72) Inventor: Adnan Al-Adnani, Brussels (GR)

(73) Assignee: Keysight Technologies, Inc., Santa Rosa, CA (US)

( * ) Notice: Subject to any disclaimer, the term of this patent is extended or adjusted under 35 U.S.C. 154(b) by 1115 days.

(21) Appl. No.: 13/661,834

(22) Filed: Oct. 26, 2012

(65) Prior Publication Data

US 2014/0122025 A1 May 1, 2014

(51) Int. Cl.
G06F 17/14 (2006.01)
G01R 23/175 (2006.01)
G01R 23/167 (2006.01)

(52) U.S. Cl.
CPC ......... *G01R 23/175* (2013.01); *G01R 23/167* (2013.01)

(58) Field of Classification Search
CPC ........ G01R 23/16; G01R 23/165; G06F 17/14
See application file for complete search history.

(56) References Cited

U.S. PATENT DOCUMENTS

| | | | |
|---|---|---|---|
| 4,848,354 A | 7/1989 | Angelsen et al. | |
| 5,075,619 A | 12/1991 | Said | |
| 5,495,432 A * | 2/1996 | Ho | G06F 17/141 370/210 |
| 6,218,896 B1 * | 4/2001 | Becker et al. | 329/304 |
| 7,509,154 B2 * | 3/2009 | Diab | A61B 5/14546 600/323 |
| 7,612,275 B2 | 11/2009 | Seppanen et al. | |
| 8,128,572 B2 | 3/2012 | Diab et al. | |
| 2008/0052335 A1 * | 2/2008 | Gee | G01R 23/16 708/400 |
| 2009/0144004 A1 * | 6/2009 | Feldhaus | G01R 23/16 702/77 |

(Continued)

FOREIGN PATENT DOCUMENTS

| | | |
|---|---|---|
| CN | 101231315 A | 7/2008 |
| CN | 101692108 A | 4/2010 |
| CN | 102650658 A | 8/2012 |

OTHER PUBLICATIONS

Wang et al.,Channelized receiver with WOLA filterbank, 2006,IEEE,0-7803-9582—Apr. 2006, 1-3.*

(Continued)

*Primary Examiner* — Mohammad K Islam

(57) ABSTRACT

A method is provided for performing real-time spectral analysis of a non-stationary signal. The method includes sampling the non-stationary signal, using an observation window having a length short enough to approximate a stationary signal, to provide an initial set of sampled data, buffering the initial set of sampled data to obtain multiple buffered sets of sampled data, filtering the initial set of sampled data and the buffered sets of sampled data, using corresponding filter responses, to obtain multiple filtered sets of sampled data, and performing a chirp-z-transform (CZT) of the filtered sets of sampled data to provide a set of discrete Fourier transforms (DFT) coefficients. A total signal spectrum of the non-stationary signal is reconstructed using the set of DFT coefficients.

20 Claims, 9 Drawing Sheets

(56) References Cited

U.S. PATENT DOCUMENTS

| | | | | |
|---|---|---|---|---|
| 2010/0198899 A1* | 8/2010 | Dickson | ............. | G10L 19/0204 708/322 |
| 2010/0204939 A1* | 8/2010 | Hillman, Jr. | ....... | G01R 13/0254 702/76 |
| 2010/0293214 A1* | 11/2010 | Longley | ................ | G06F 17/156 708/313 |
| 2011/0037643 A1* | 2/2011 | Torin | ...................... | G01S 7/285 342/173 |
| 2011/0158306 A1* | 6/2011 | Akita | ...................... | H04L 1/206 375/228 |
| 2011/0183622 A1* | 7/2011 | Apostolos | ............. | H04B 15/02 455/63.1 |
| 2011/0206163 A1* | 8/2011 | Lowdermilk | .......... | G01R 23/16 375/316 |
| 2012/0078557 A1* | 3/2012 | Dobyns | ............. | G01R 13/0236 702/66 |
| 2012/0265534 A1* | 10/2012 | Coorman | .............. | G10L 13/033 704/265 |
| 2014/0032150 A1* | 1/2014 | Follett | ................ | G01R 13/0263 702/79 |
| 2014/0079248 A1* | 3/2014 | Short | .................. | G10L 21/0272 381/119 |
| 2014/0219666 A1* | 8/2014 | Tselniker | .......... | H04L 25/03019 398/208 |

OTHER PUBLICATIONS

Ferrie et al., Partitioned and modified Chrip Z-Transform, 1973, 10.1109/OCEANS.1973.1161249,106-111.*

Al-Adnani, et al. "Spectrum Analyzers Today and Tomorrow: Part 1,Towards filterbanks-enabled real-time spectrum analysis," IEEE Instrumentation & Measurement Magazine, Oct. 2013.

Al-Adnani, et al. "Spectrum Analyzers Today and Tomorrow: Part 2,Towards filterbanks-enabled real-time spectrum analysis," IEEE Instrumentation & Measurement Magazine, Dec. 2013.

Rabiner, et al. "The Chirp z-Transform Algorithm," IEEE Transactions on audio and electroacoustics, vol. 17, No. 2, Jun. 1969.

TEKTRONIX, Inc., "Fundamentals of Real-Time Spectrum Analysis," Firmenschrift 37W-17249-4, Aug. 2009.

Wang, et al. "Channelized Receiver with WOLA Filterbank," Proceedings of the International Conference on Radar, Shanghai, 2006.

Search Report dated Jun. 18, 2014 in German Patent Application No. 102013217181.1.

Chinese Decision to Grant dated Dec. 22, 2017 with English translation.

Thomas F. Quatieri, Jr., "Short-Time Spectral Analysis with Conventional and Sliding CZT," IEEE Transactions on Acoustics, Speech, and Signal Processing, vol. ASSP_26, No. 6, Dec. 1978, pp. 561-566.

L.R. Rabiner et al., "The Chirp-Z transform Algorithm and Its Application,"Bell System Technical Journal 48 (No. 5), pp. 1249-1292 (May-Jun. 1969).

http://en.wikipedia.org/wiki/Digital_down_converter.

Office Action dated Jul. 3, 2017 in Chinese Patent Application No. 201310445073.7 (Unofficial/non-certified translation provided by foreign agent included), 11 pages.

English language machine translation of CN101231315, published Jul. 30, 2008, 24 pages.

English language machine translation of CN101692108, published Apr. 7, 2010, 8 pages.

English language machine translation of CN102650658, published Aug. 29, 2012, 15 pages.

* cited by examiner

METHOD AND SYSTEM FOR PERFORMING REAL-TIME SPECTRAL ANALYSIS OF NON-STATIONARY SIGNAL

BACKGROUND

Conventional methods of performing spectral analysis of signals assume that the input signals have constant harmonic content during the sampling operation during an observation window. In many applications, signals are time-dependent (non-stationary or transient), and may be considered as stationary for purposes of observation only when the duration or length of the observation window is appropriately short. For example, the length of the observation window should be less than the period of intermittence or transience, so that the signal statistics remain stationary throughout the observation window. In contrast, in order to obtain good spectral resolution of the signal, the number of samples is increased, which requires use of a longer observation window.

Generally, a fast Fourier transform (FFT) is not suitable when a narrow frequency band of a non-stationary signal has to be analyzed because good spectral resolution is not possible with a short observation window. To improve both spectral resolution and resolution by using the FFT, a longer observation window, i.e., a large number of points, is required. However, a non-stationary signal cannot be considered stationary throughout a long duration observation window because non-stationary signals are not constant. Therefore, it is difficult to obtain good spectral resolution, while at the same time reducing the length of the observation window to accommodate a non-stationary signal. In other words, it may not be possible to increase the length of the observation window because the non-stationary signal can be assumed to be stationary only for a short time interval.

Another limitation of the FFT is that it requires analysis of the entire spectrum, even when evaluating the signal spectral content only in a limited frequency band. Accordingly, since a fixed resolution for the frequency band under consideration is needed, the entire spectrum must be analyzed with the same resolution. This may result in a long observation window, which prevents the assumption that the signal is stationary, as discussed above.

In comparison, a chirp z-transform (CZT) algorithm does not require analysis of the entire spectrum with the same resolution, as does the FFT. In this way, the CZT provides a limited spectral analysis with better spectral resolution since the CZT does not depend only on the length of the observation window, like the FFT (and other classic methods, such as Welch). Rather, the CZT depends on the ratio between the analyzed spectral band and sampling frequency. In this case, after choosing a frequency band, it is possible to obtain a good spectral resolution even with a considerably lower number of samples and consequently a shorter observation window. In this way the CZT allows all the performance parameters to be optimized even if a shorter observation window is required.

The CZT enables use of only the sampled data to obtain a zoomed signal display without any further operation to correct leakage or amplitude errors. Also, it is possible to use the CZT to reconstruct the total signal spectrum, even for non-stationary signals, by processing different CZTs on limited spectrum portions, using the same buffered sampled data. CZT alone does not provide an enhanced resolution spectrum for the zoomed or the entire bandwidth of the signal. Therefore, there is a need to obtain more accurate signal analysis by improving spectral resolution, which cannot be done using CZT alone.

SUMMARY

In a representative embodiment, a method is provided for performing real-time spectral analysis of a non-stationary signal. The method includes sampling the non-stationary signal, using an observation window having a length short enough to approximate a stationary signal, to provide an initial set of sampled data; buffering the initial set of sampled data to obtain multiple buffered sets of sampled data; filtering the initial set of sampled data and the buffered sets of sampled data, using corresponding filter responses, to obtain multiple filtered sets of sampled data; and performing a chirp-z-transform (CZT) of the filtered sets of sampled data to provide a set of discrete Fourier transforms (DFT) coefficients. A total signal spectrum of the non-stationary signal is reconstructed using the set of DFT coefficients.

In another representative embodiment, a method is provided for performing real-time spectral analysis of a non-stationary signal. The method includes sampling the non-stationary signal, using a short observation window to approximate a stationary signal, to provide sampled signals; filtering the sampled signals using a first polyphase filter to provide first filtered sampled signals; delaying the sampled signals to provide delayed sampled signals; filtering the delayed sampled signals using a second polyphase filter to provide second filtered sampled signals; performing CZTs of the first and second filtered sampled signals to provide DFT coefficients; and reconstructing a total signal spectrum of the non-stationary signal using the DFT coefficients.

In another representative embodiment, a system is provided for performing real-time spectral analysis of an input signal from a device under test (DUT). The system includes a sampler configured to sample the input signal to provide first sampled data, a first polyphase filter configured to filter the first sampled data to provide first filtered sampled data, a first buffer configured to delay the first sampled data by a first delay to provide second sampled data, a second polyphase filter configured to filter the second sampled data to provide second filtered sampled data; a second buffer configured to delay the second sampled data by a second delay to provide third sampled data, and a third polyphase filter configured to filter the third sampled data to provide third filtered sampled data. The system further includes an adder configured to add the first, second and third filtered sampled data to provide summed filtered data, and a CZT circuit configured to perform a CZT on the summed filtered data to provide frequency domain samples corresponding to the input signal. The frequency domain samples enable reconstruction of a total signal spectrum of the input signal.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
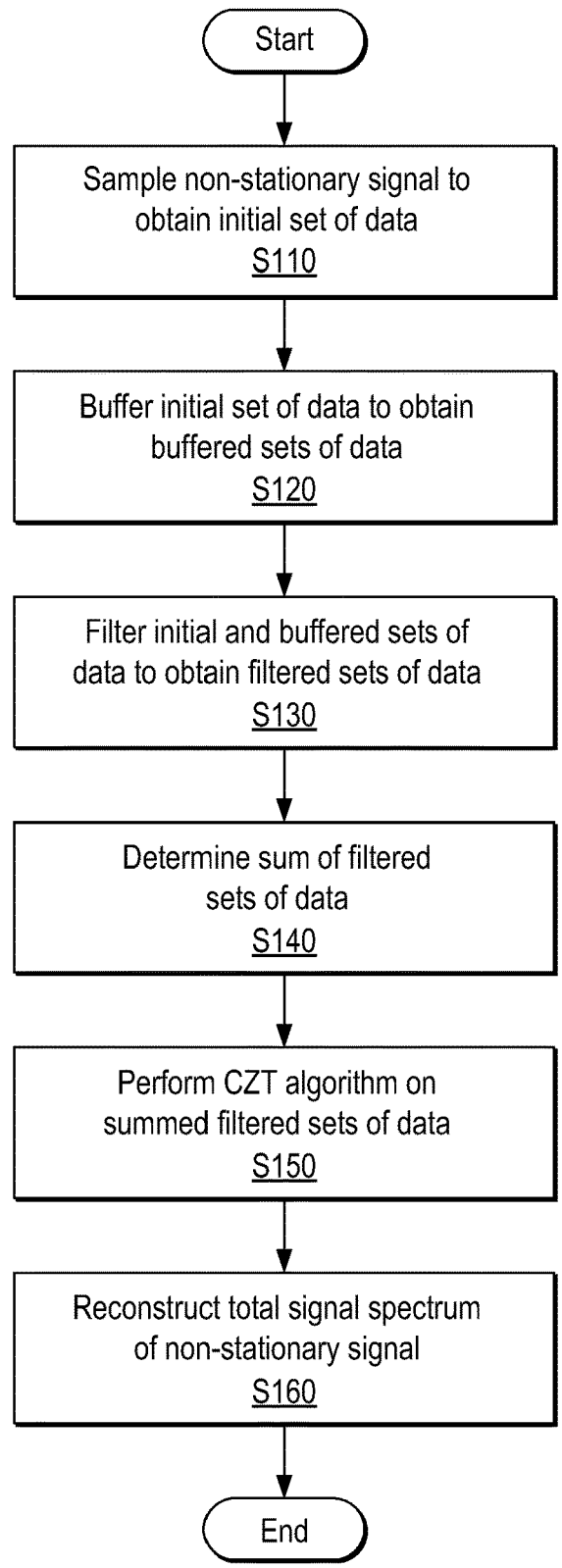
FIG. 1 is a flow diagram of a method for performing real-time spectral analysis of a non-stationary signal using a streaming filter bank based CZT algorithm, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal Various embodiments provide sampling systems and methods for performing real-time spectral analysis of a non-stationary signal. Generally, a non-stationary signal is sampled using a short observation window in order to approximate a stationary signal. The sampled signal is filtered by a series of filter banks, which provide an enhanced resolution spectrum for the entire bandwidth of the sampled signal. A CZT algorithm is performed on the filtered signal by a CZT circuit, which enables a zoom display of arbitrary bandwidths (e.g., having minimum and maximum frequencies [$f_{min}$, $f_{max}$]) selectable by the user. The combination provides the ability to zoom and identify features at enhanced resolution across the entire bandwidth of the sampled signal.

FIG. 1 is a flow diagram of a method for performing real-time spectral analysis of a non-stationary signal using a streaming filter bank based CZT algorithm, according to a representative embodiment.

Referring to FIG. 1, a non-stationary signal is received and sampled at block S110, using an observation window having a length short enough to approximate a stationary signal, in order to provide an initial set of sampled data. The signal may be a discrete signal output by a device under test (DUT), for example, in response to a stimulus.

In block S120, the initial set of sampled data is buffered to obtain multiple buffered sets of sampled data. Each of the initial set of sampled data and the multiple buffered sets of sampled data correspond to a limited spectrum portion of a total signal spectrum of the non-stationary signal. Collectively, the buffered sets of sampled data effectively emulate data collected using a longer observation window based on the non-stationary signal sampled through the short observation window. Therefore, spectral resolution of the non-stationary signal may be improved due to a relatively larger input data set, including the initial and buffered sets of sampled data, mitigating frequency resolution error, for example.

For example, the initial set of sampled data may be provided to a first buffer (or other delay circuit) to be delayed by a predetermined first delay time. The output of the first buffer (i.e., first delayed data) may then be provided to a second buffer to be delayed by a predetermined second delay time, which may be the same as or different from the first delay time. The output of the second buffer (i.e., second delayed data) may then be provided to a third buffer to be delayed by a predetermined third delay time, which may be the same as or different from the first and second delay times. In various embodiments, the total number of buffers may be any positive integer, selectable by the user. The total number of buffers is directly proportional to the desired (emulated) length of the observation window.

In block S130, the initial set of sampled data and the multiple buffered sets of sampled data are filtered by polyphase filters using corresponding filter responses to obtain multiple filtered sets of sampled data. Each of the filter responses may provide a low-pass filter, for example, using a user selectable filter coefficient. Generally, the filter response ($H(\omega)$) is the FFT of the filter coefficient ($h(n)$) for a given filter, where $\omega$ is the frequency index and n is the coefficient index. In various embodiments, the filter responses may be derived from a single filter. Similar to the buffers, the total number of polyphase filters in an given implementation is directly proportional to the desired (emulated) length of the observation window. For example, two filters would effectively double the length of the observation window used to collect the initial set of sampled data. The number of polyphase filters (and corresponding buffers) may be determined by the total bandwidth of the spectrum of the received non-stationary signal. The filtered sets of sampled data output by the multiple polyphase filters, respectively, are summed in block S140.

In block S150, a chirp-z-transform (CZT) is performed on the summed filtered sets of sampled data, using a CZT algorithm, to provide a set of discrete Fourier transforms (DFT) coefficients. In various embodiments, a portion of the CZT algorithm, such as pre-multipliers, may be performed by the polyphase filters. Performing the CZT algorithm may include performing a fast Fourier transform (FFT) on the summed filtered sets of sampled data, filtering the FFT sets of sampled data using an FFT of a complex chirp function, discussed below, performing an inverse FFT (IFFT) on the filtered FFT sets of sampled data, and filtering the IFFT sets of sampled data using another complex chirp function to provide the set of DFT coefficients.

Figure 4:
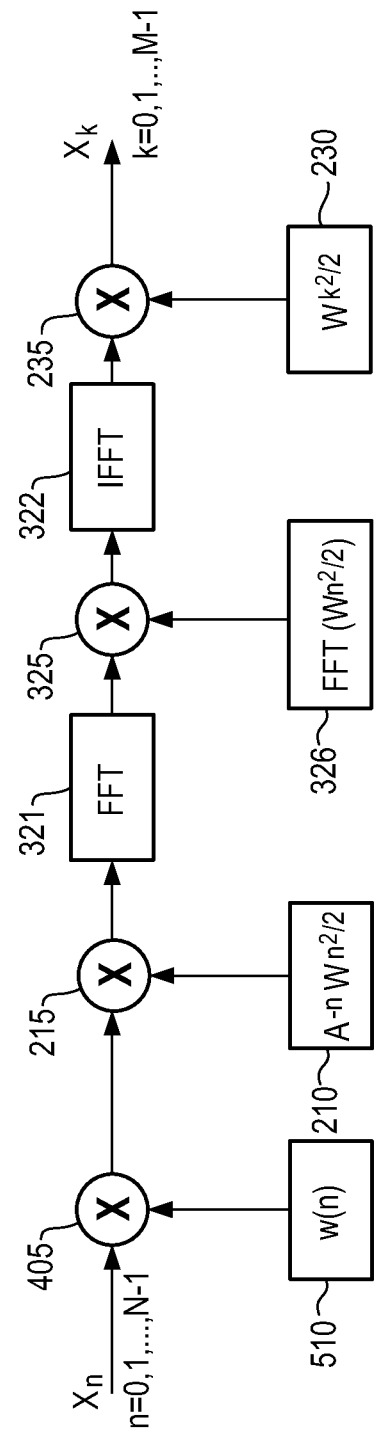
FIG. 4 is a functional block diagram representing a windowed FFT based CZT algorithm, indicating non-stationary signals.

The total signal spectrum of the received non-stationary signal may then be reconstructed in block S160 using the set of DFT coefficients. Reconstructing the total signal spectrum of the non-stationary signal may include evaluating the set of DFT coefficients in a z-plane, for example, where the set of DFT coefficients lie on circular or spiral contours beginning at an arbitrary point in the z-plane, as indicated by FIG. 4, discussed below.

The blocks in FIG. 1 may be implemented using a processing device, such as processor, a digital signal processor (DSP), one or more application specific integrated circuits (ASICs), one or more field-programmable gate arrays (FPGAs), or combinations thereof, using software, firmware, hard-wired logic circuits, or combinations thereof. When using a computer processor and/or a DSP, for example, a memory may be included for storing executable software/firmware and/or executable code that allows it to perform the various functions. The memory may be a non-transitory computer readable medium, and may include any number, type and combination of random access memory (RAM) and non-volatile memory (e.g., read-only memory (ROM)), for example. A filter bank, all or part of which may be implemented by the processing device, may provide the functionality of the polyphase filters and corresponding filter responses. The filter bank receives the non-stationary signal from an analog-to-digital converter (ADC), and enables display of all or a selected portion of the signal spectrum on a display device.

Figure 6:
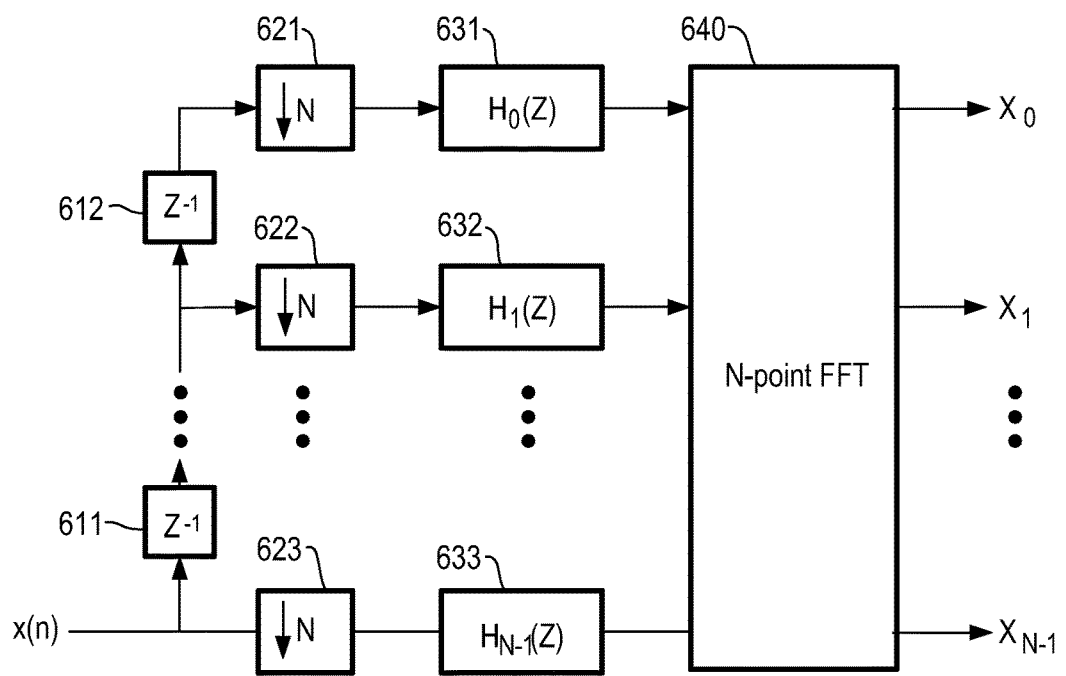
FIG. 6 is a functional block diagram representing a filter bank of a spectral analyzer.
Figure 7:
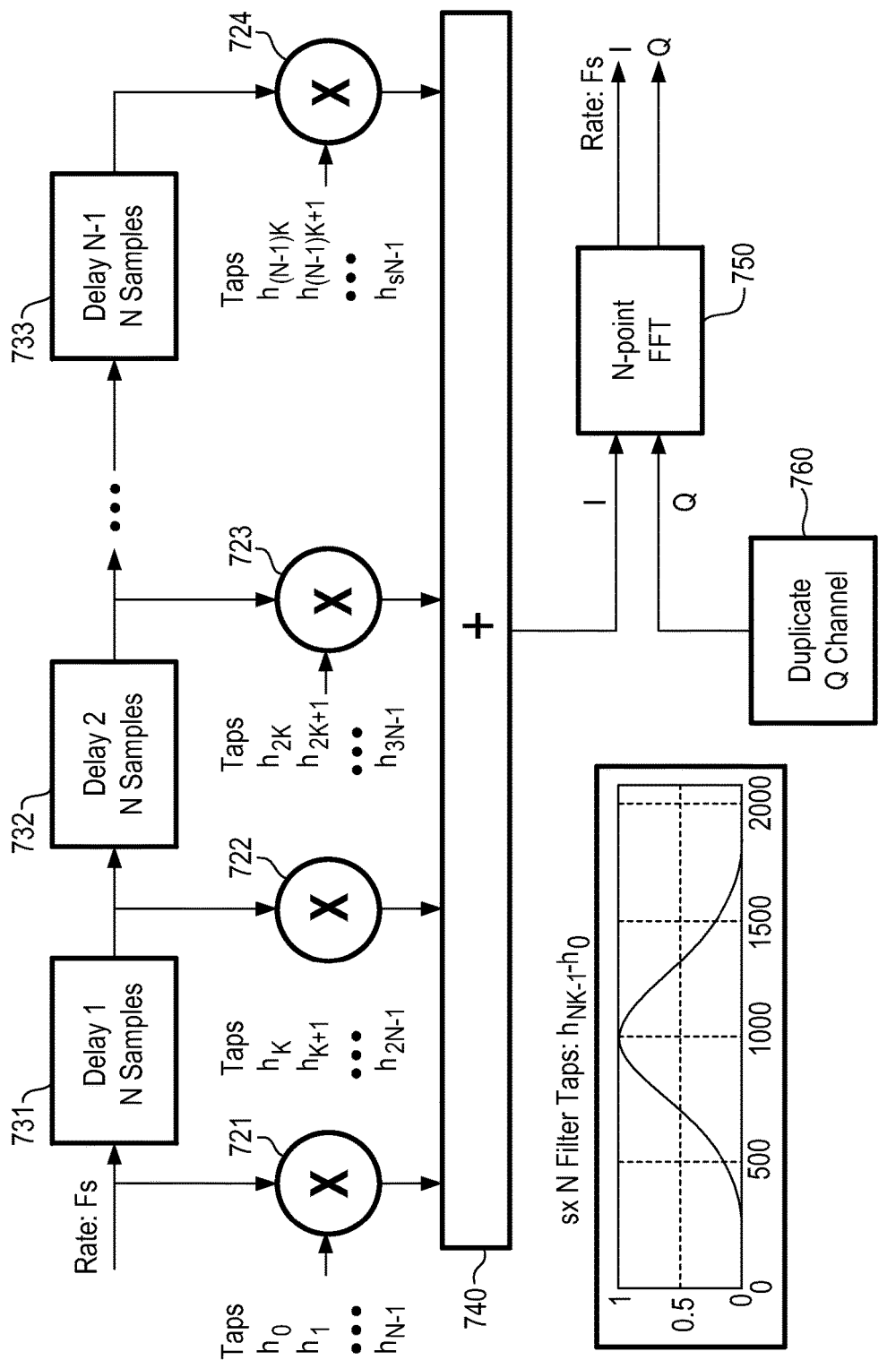
FIG. 7 is a functional block diagram representing a streaming filter bank of a spectral analyzer.
Figure 8:
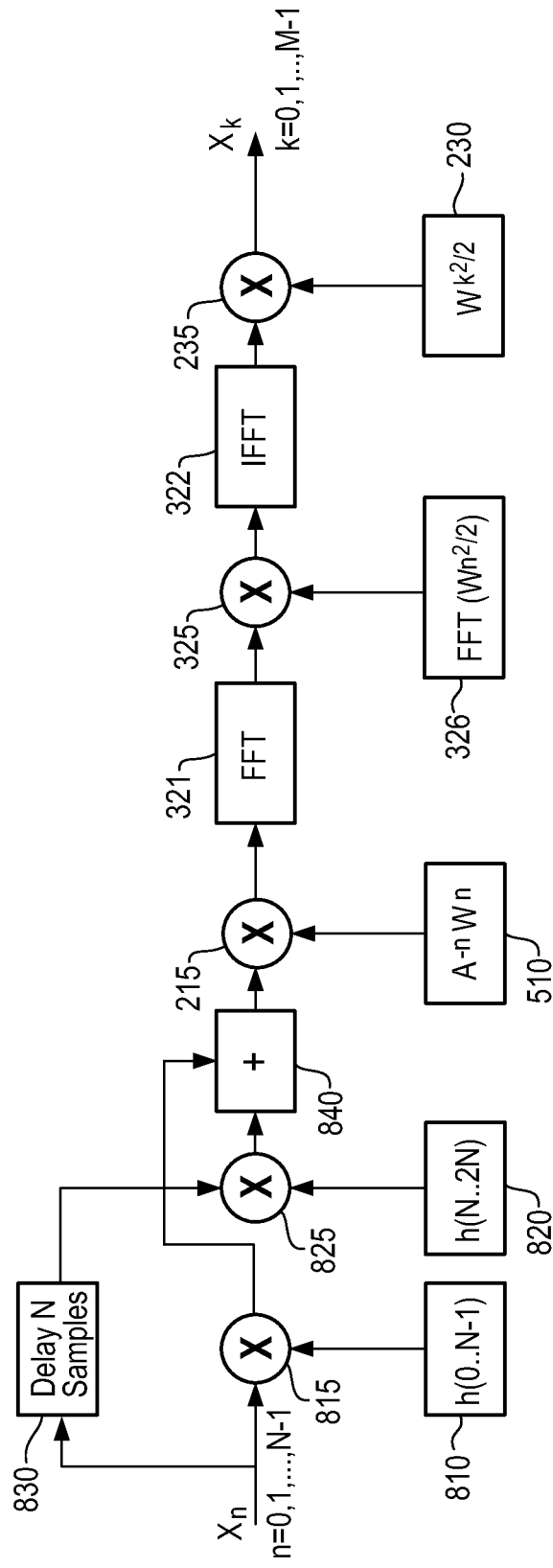
FIG. 8 is a functional block diagram representing a streaming filter bank based CZT algorithm, according to a representative embodiment.
Figure 9:
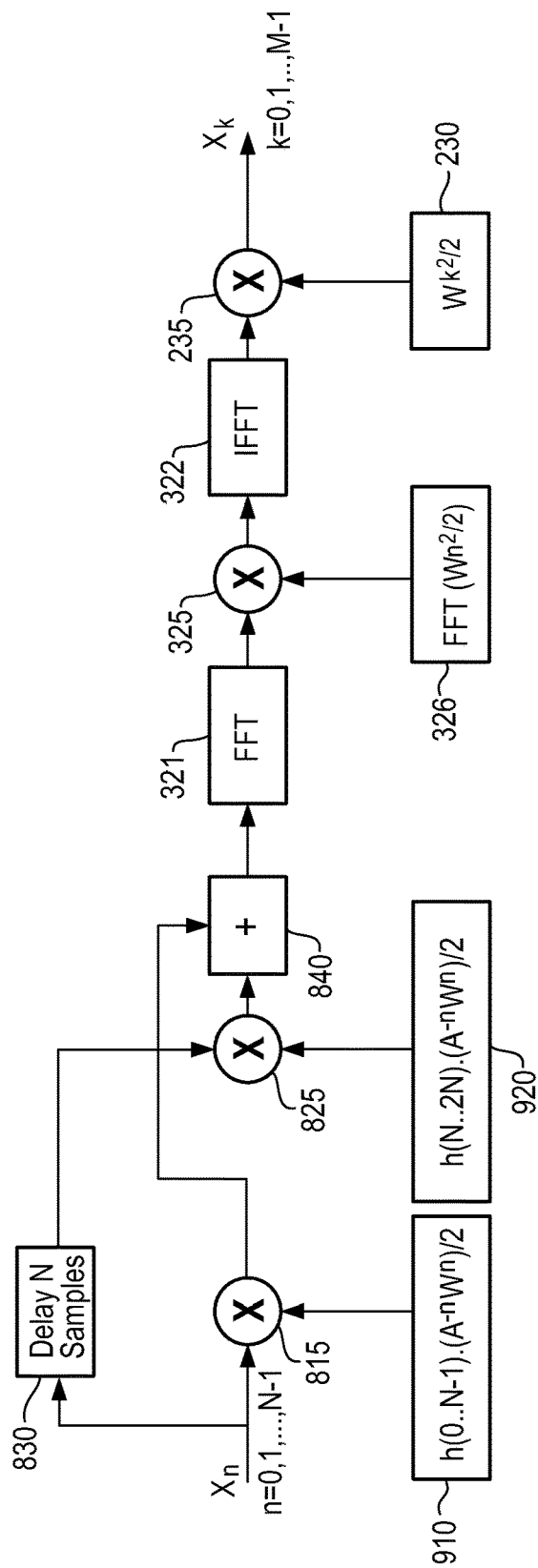
FIG. 9 is a functional block diagram representing a streaming filter bank based CZT algorithm, according to a representative embodiment.
Figure 10:
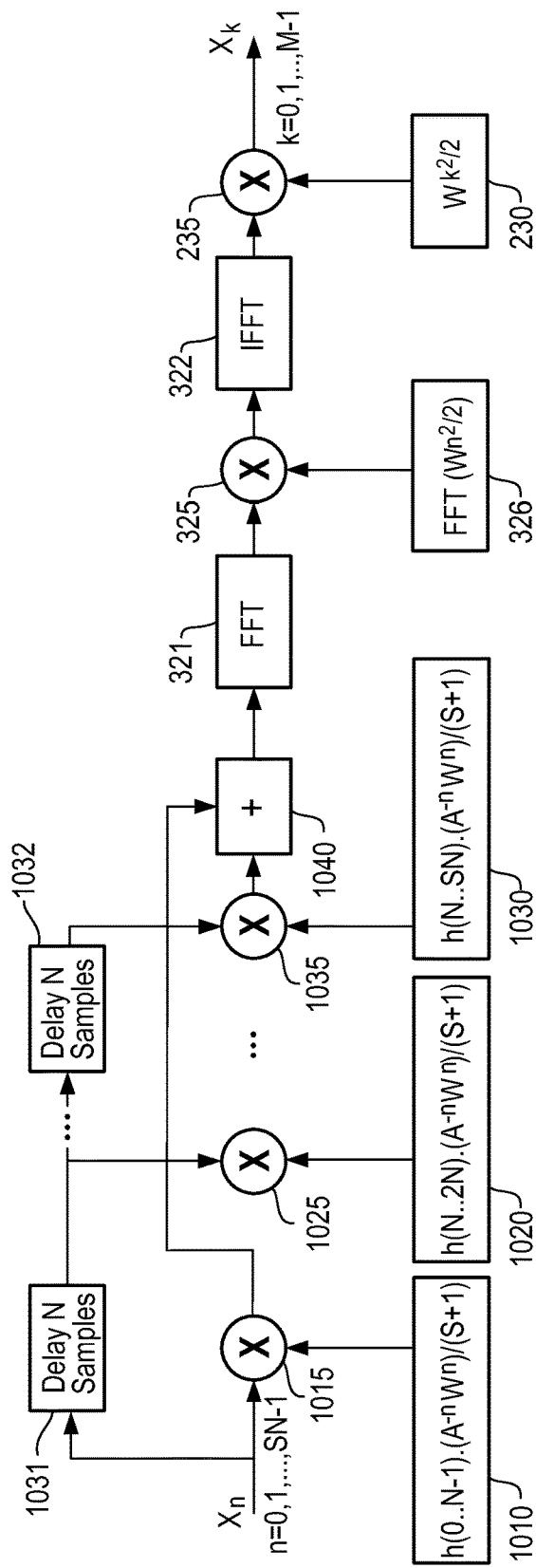
FIG. 10 is a functional block diagram representing a streaming filter bank based CZT algorithm, according to a representative embodiment.

Herein, FIGS. 2-10 are functional block diagrams representing various CZT algorithms. FIGS. 8-10 in particular are functional block diagrams representing streaming filter bank based CZT algorithms, according to representative embodiments. FIGS. 2-7 are relied upon for explaining the streaming filter bank based CZT algorithms in FIGS. 8-10.

Figure 11:
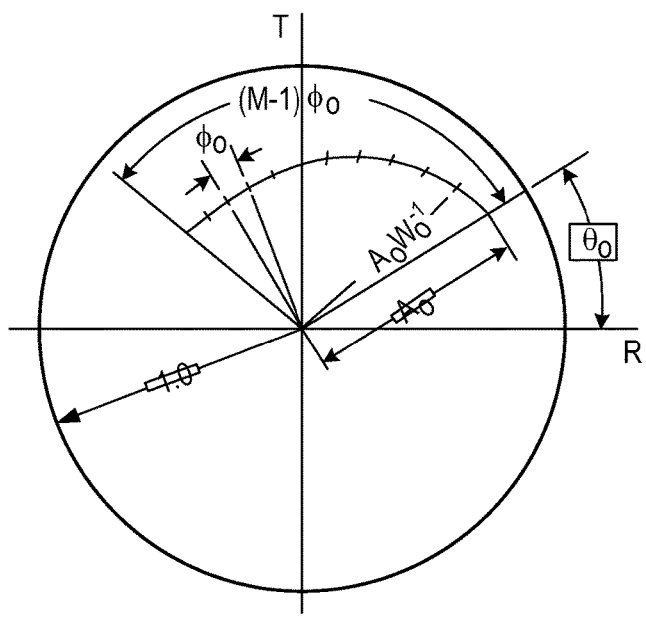
FIG. 11 is a chart showing a CZT spiral contour in the z-plane for evaluation of a CZT.

Generally, a CZT algorithm is an efficient technique for numerically evaluating a z-transform of a sequence of N samples (where N is a positive integer) from a received input signal. The CZT algorithm enables evaluation of the z-transform at M points (where M is a positive integer) in the z-plane, which lie on circular or spiral contours beginning at any arbitrary point in the z-plane as shown in FIG. 11, for example. The CZT algorithm is based on the fact that the values of the z-transform on the circular or spiral contours may be expressed as a discrete convolution. The DFT for a discrete signal $x(n)$ is indicated by $X_k$, and provided by Equation (1), where $x(n)$, $0 \leq n \leq N-1$ is a given N point sequence:

$$X_k = \sum_{n=0}^{N-1} x(n) e^{-\frac{j2\pi kn}{N}} \quad (1)$$

In general, the complex exponent of Equation (1) may be expressed by Equation (2), as follow:

$$e^{-\frac{j2\pi k}{N}} = AW^k, k = 0, 1, \ldots, M-1 \quad (2)$$

In Equation (2), M is an arbitrary integer, and A and W are arbitrary complex numbers, defined by Equations (3) and (4), respectively:

$$A = A_0 e^{j2\pi\theta_0}, \quad (3)$$

and $$W = W_0 e^{j2\pi\varphi_0} \quad (4)$$

The chirp-z bandwidth $[f_{min}, f_{max}]$ may be defined by Equations (5) and (6), where $F_S$ is the sampling frequency:

$$\frac{1}{F_s} = \frac{(M-1)\varphi_0}{(f_{max} - f_{min})} \quad (5)$$

$$\frac{1}{F_s} = \frac{\theta_0}{f_{min}} \quad (6)$$

Then, frequencies $\theta_0$ and $\varphi_0$ may be determined according to Equations (7) and (8), respectively.

$$\varphi_0 = \frac{(f_{max} - f_{min})}{(M-1)F_s} \quad (7)$$

$$\theta_0 = \frac{f_{min}}{F_s} \quad (8)$$

Accordingly, arbitrary complex numbers A and W may be determined according to Equations (9) and (10):

$$A = A_0 e^{j2\pi f_{min}/F_s}, \quad (9)$$

and $$W = W_0 e^{j2\pi(f_{max} - f_{min})/(M-1)F_s} \quad (10)$$

For general spectral analysis, each of complex numbers $A_0$ and $W_0$ is equal to one, where the DFT is evaluated on the unit circle. It is apparent that the frequency $\theta_0$ determines the starting frequency $[f_{min}]$ and the frequency $\varphi_0$ determines the end frequency $[f_{max}]$ and resolution.

Equation (1) may then be expressed as Equation (11):

$$X_k = \sum_{n=0}^{N-1} x(n) A^{-n} W^{nk} \quad (11)$$

By expressing nk as $(n^2 + k^2 - (k-n)^2)/2$, Equation (11) may be expressed as Equation (12):

$$X_k = \sum_{n=0}^{N-1} x(n) A^{-n} W^{[n^2 + k^2 - (k-n)^2]/2} \quad (12)$$

$$= \sum_{n=0}^{N-1} \left[ x(n) A^{-n} W^{n^2/2} \right] W^{k^2/2} W^{-(k-n)^2/2}$$

Equation (12) may take the form of a convolution, as indicated by Equation (13):

$$X_k = W^{k^2/2} \sum_{n=0}^{N-1} y(n) v(k-n) \quad (13)$$

where, $$y(n) = x(n) A^{-n} W^{n^2/2},$$

and $$v(n) = W^{n^2/2}$$

Figure 2:
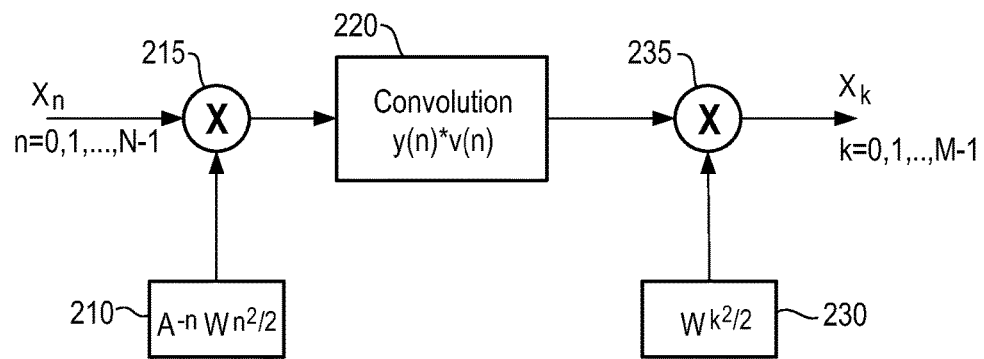
FIG. 2 is a functional block diagram representing a chirp z-transform (CZT) algorithm.

FIG. 2 is a functional block diagram representing the CZT algorithm of Equation (13). Each of the blocks in FIG. 2 (as well as the functional block diagrams discussed herein with regard to FIGS. 3-10) may represent a processing module, such as a software module, for example, configured to perform the depicted function. The processing modules may be executed by a processing device, which may be implemented by a processor, a DSP, one or more ASICs, one or more FPGAs, or combinations thereof, using software, firmware, hard-wired logic circuits, or combinations thereof, as discussed above.

Referring to FIG. 2, multiplier 215 determines the product of sampled discrete signal $x_n$ (where n=0, 1, . . . , N−1) and function block 210, which is output to convolution block 220. Multiplier 235 determines the product of the output of the convolution block 220 and function block 230 to provide $X_k$ (where k=0, 1, . . . , M−1), which is the DFT for the discrete signal $x_n$. The convolution block 220 performs the convolution function y(n)*v(n), indicated by Equation (13). The function block 210 performs the function $A^{-n}W^{n^2/2}$ and the function block 230 performs the function $W^{k^2/2}$, also identified above with reference to Equation (13).

The convolution of Equation (13) may also be implemented in the frequency domain using FFT, as shown by Equation (14):

$$X_k = W^{k^2/2} \cdot \text{IFFT}[\text{FFT}(y(n)) \cdot \text{FFT}(v(n))] \quad (14)$$

Figure 3:
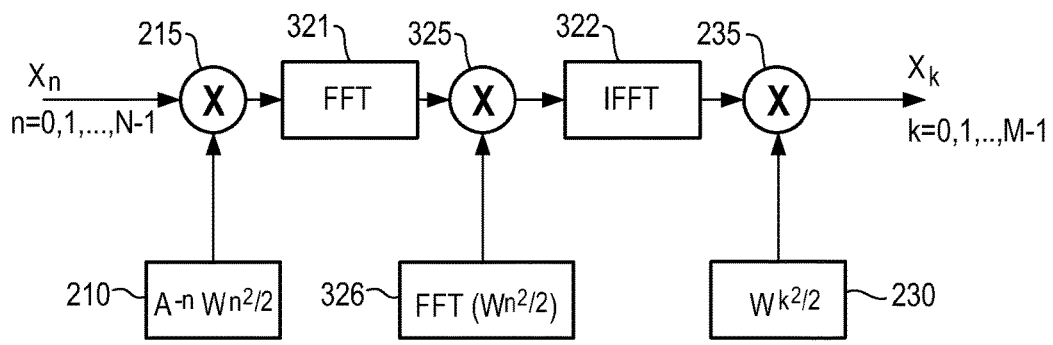
FIG. 3 is a functional block diagram representing a CZT algorithm according to a frequency domain based implementation.

FIG. 3 is a functional block diagram representing the CZT algorithm of Equation (14) according to a frequency domain based implementation. FIG. 3 depicts the product of sampled discrete signal $x_n$ and the function block 210 received from the multiplier 215 by FFT block 321. Multiplier 325 determines the product of the output of the FFT block 321 and FFT function block 326, which performs a FFT on the function $W^{n^2/2}$. The output of the multiplier 325 is provided to IFFT block 322, which performs an inverse FFT. The multiplier 235 determines the product of the output of the IFFT block 322 and the function block 230 to provide $X_k$, which is the DFT for the discrete signal $x_n$.

The DFT in the z-plane is represented by a unit circle. As CZT is a more general algorithm, it is apparent that it can evaluate the z-transform at points both inside and outside the unit circle shown in FIG. 11, for example, which shows a CZT spiral contour in the z-plane for evaluation of the transform. In order to prevent circular convolution effects, the sizes of the FFTs are constrained to be L≥M+N−1, where L is FFT size.

In high resolution spectral analysis, the user may be interested in the ability of the CZT algorithm to efficiently evaluate high resolution, narrow frequency band spectra, indicated by ΔF. Using standard FFT techniques, in order to achieve a frequency resolution of ≤ΔF, with a sampling frequency of the data of 1/T, requires N≥1/(T·ΔF) points. For very small ΔF, this implies very large values of N. However, high resolution may be required for a limited range of frequencies, while low resolution may be used for the remainder of the spectrum. An example of such an application is in wideband spectral analysis, where a zoom function may be used to look at details of the frequency response in a narrow frequency band of interest, and only a gross look at the rest of the spectrum. Another example is the design of band-pass or low-pass filters. Usually, it is desirable to provide a microscopic look at details of the frequency response in the pass-band and only a gross look outside the pass-band. The applicability of the CZT algorithm for such frequency expansions is a powerful tool for close examination of small frequency bands, as well as for debugging implementations of digital filters. Whether a desired filter meets its design specification of in-band ripple, transition ratio, etc., may be easily checked.

One situation in which the CZT algorithm is useful is for calculating the spectrum of an extremely long sequence for which a fine grained spectrum is desired over a narrow band of frequencies, normally requiring very long FFTs. For example, for a sequence of P samples (where P is a positive integer), desiring the spectral samples where M<<P, the CZT algorithm may be broken up into r sums over N, where rN>>P. Each of the r sums can be evaluated using the CZT algorithm, requiring storage on the order of 3(N+M−1) locations. In addition, 2M locations are required to accumulate the M complex values of the transform. Although two FFTs and 2M complex multiplications are required for each of the r transforms, it is still possible that a saving in total time may realized as compared to evaluation of a P point transform using large external memory or disk storage. The CZT algorithm is well suited for such cases, since it allows selection of initial frequency and frequency spacing independent of the number of time samples, as described for example, by L. R. Rabiner et al., *The Chirp-Z transform Algorithm and Its Application*, BELL SYSTEM TECHNICAL JOURNAL 48 (No. 5), pp. 1249-1292 (May-June 1969), which is hereby incorporated by reference. Hence high resolution data over a narrow frequency range can be attained at low cost.

An alternative spectral zoom technique employs a digital down converter to provide a zoom function prior to the FFT through a classic heterodyne technique, as is known in the art. In this technique, the wideband signal is mixed with a synthesized carrier at or near the carrier frequency of the band of interest to baseband that channel. The resulting signal is then filtered and decimated to isolate and extract the band of interest from the wideband signal, and reduce the overall sample rate to the minimum necessary to support the desired band. Depending on the bandwidth of the channel of interest, different filtering and decimation techniques may typically employed. For example, for wider bandwidth signals, requiring decimations of eight or less, a wideband finite impulse response (FIR) filter is utilized directly following the baseband mixer. The output of this filter is then decimated by an appropriate amount. For narrower bandwidth signals, the filtering and decimation functions are typically split into multiple stages. An initial stage is provided by a cascade integrator comb (CIC) filter, which provides for reasonable first stage channel isolation while minimizing the number of complex operations that must be performed prior to decimation. Follow-on filtering may then provided by a narrowband FIR filter, which may have programmable taps to allow the filtering to be optimized for the band of interest. The computational complexity of these algorithms is dependent upon the respective implementation details. At a minimum, the wideband DDC requires six operations for the mixing function and six operations per tap (two multiplies, two adds and two shifts) for the FIR filtering. For large decimation and zooming requirements, a very large FIR filter is required making a frequency domain implementation more feasible using FFTs. In this case the CZT algorithm approach may be more cost effective since all the tuning and filtering operations are integrated within the CZT architecture and does not have to be limited to power of two frequency points.

In the digital spectral analysis of finite sequences, windowing is applied to the input signal to reduce frequency leakage that occurs due to evaluating the DFT on finite length signals. The implication of windowing on performance and implementation of the CZT algorithm is analyzed below.

A windowed DFT is a simple modification of Equation (1), as shown by Equation (15), where w(n) is a window sequence of length N:

$$X_k = \sum_{n=0}^{N-1} w(n)x(n)e^{\frac{-j2\pi kn}{N}} \quad (15)$$

Therefore, Equations (13) and (14) become Equation (16), below, which provides a windowed FFT based CZT algorithm:

$$X_k = W^{k^2/2} \sum_{n=0}^{N-1} y(n)v(k-n) \quad (16)$$

where, $$y(n) = w(n)x(n)A^{-n}W^{n^2/2},$$

and $$v(n) = W^{n^2/2}$$

Figure 5:
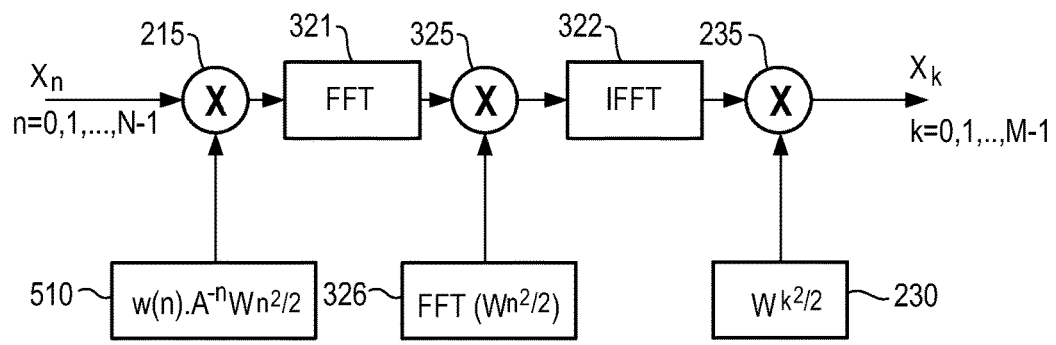
FIG. 5 is a functional block diagram representing the windowed FFT based CZT algorithm shown in FIG. 4, with combined pre-multipliers.

FIG. 4 is a functional block diagram representing the windowed FFT based CZT algorithm of Equation (16). FIG. 5 is a functional block diagram representing the windowed FFT based CZT algorithm shown in FIG. 4, where the pre-multipliers are combined.

Referring to FIG. 4, multiplier 405 determines the product of the sampled discrete signal $x_n$ and function block 410, which performs windowing function w(n). The multiplier 215 determines the product of the output of multiplier 405 and function block 210, discussed above. FFT block 321 performs a FFT on the output of the multiplier 215, and multiplier 325 determines the product of the output of the FFT block 321 and function block 326, discussed above. The output of the multiplier 325 is provided to the IFFT block 322, which performs an inverse FFT. Multiplier 235 determines the product of the output of the IFFT block 322 and function block 230, discussed above, to provide $X_k$, which is the DFT for the discrete signal $x_n$. Referring to FIG. 5, the functions of function blocks 410 and 210 are combined into function block 510, which thus performs function w(n)·$A^{-n}W^{n^2/2}$.

Spectral analysis methods assume that the processed signals have a constant harmonic content during the sampling operation (i.e., during the duration of the observation window). In many common applications, signals are time-dependent and can usually be considered as stationary only if the length of the observation window is appropriately short. However, in order to obtain good signal spectral resolution, the number of samples must be increased, which increases the length of the observation window.

The FFT is not suitable when a narrow frequency band of a non-stationary signal is analyzed, because good spectral resolution is not possible with a short duration observation window. To improve both spectral resolution and resolution by using the FFT, a relatively long observation window (i.e., a large number of samples) is required. However, a transient signal cannot be considered stationary in a long window because time-dependent signals are not constant. Therefore, it is a problem to obtain good spectral resolution, while reducing the length of the observation window.

Under some circumstances, it may not be possible to increase the length of the observation window because the signal may be assumed to be stationary for only a short time interval. In addition, application of the FFT requires analysis of the entire signal spectrum, even if it is necessary to evaluate the signal spectral content only in a limited frequency band. This means that, since a fixed resolution for the frequency band under consideration is needed, the entire spectrum has to be analyzed with the same resolution, which may produce a long observation window. The long observation window contradicts the assumption that the input signal should be regarded as stationary.

The CZT algorithm does not require analysis of the entire spectrum with the same resolution, as does the FFT. Thus, the CZT algorithm provides a limited spectral analysis with a considerably better spectral resolution, since the CZT algorithm does not depend only on the length of the observation window, unlike classic conventional methods (e.g., FFT, Welch, etc.), but rather depends on the ratio between the analyzed spectral frequency band and the sampling frequency. In this case, after choosing a frequency band, it is possible to obtain a good spectral resolution even with a considerably lower number of samples and consequently a shorter observation window. In this way the CZT algorithm enables all the performance parameters to be optimized, even when a shorter observation window is required.

The CZT algorithm further enables the user to use only the sampled data to obtain a more accurate signal analysis without any further operation to correct leakage or amplitude errors. In addition, it is possible to use the CZT algorithm to reconstruct the total signal spectrum, even for non-stationary signals, by processing different CZTs on limited spectrum portions, using the same buffered sampled data. Therefore, the CZT algorithm is suitable both in limiting the spectral frequency error due to non-stationary signals, and in improving the spectral resolution.

Notably, one drawback in conventional windowed spectral analysis discussed above is that the length of the observation window is coupled to the length of the FFT. Therefore, to improve the windowing performance, both the observation window and FFT lengths have to be increased, which may not be practical for real time spectral analysis.

Generally, use of filter banks enable the length of the observation window to be increased independently of the length of the FFT, potentially providing increased windowing performance with shorter FFTs. FIG. 6 is a functional block diagram representing a filter bank of a spectral analyzer.

Referring to FIG. 6, filter $H_0(z)$ 631 to filter $H_{N-1}(z)$ 633 are polyphase filters representing a windowing function. The polyphase filters $H_0(z)$ 631 to filter $H_{N-1}(z)$ may be derived from a single proptotype filter H(z), as in Equation (17), below. When each of the filters $H_0(z)$ 631 to filter $H_{N-1}(z)$ 633 has length one, for example, the structure reduces to a classical windowing case, in which the polyphase filter coefficient h is equal to the windowing function w. In the general filter bank structure, the length of each filter coefficient $h_k$ may be any integer. The polyphase filters are derived from the filter coefficients $h_k$ as indicated by Equation (17):

$$h_k(n) = h(k+nN) \quad (17)$$

FIG. 6 further depicts discrete signal x(n), which is applied to filter $H_{N-1}(z)$ 633 via downsampling block 623 (↓N), to filter $H_1(z)$ 632 via delay block 611 ($Z^{-1}$) and downsampling block 622 (↓N), and to filter $H_0(z)$ 631 via delay blocks 611 and 612 ($Z^{-1}$) (as well as any intervening delay blocks) and downsampling block 621 (↓N). Each of the downsampling blocks 621 to 623 retains one out of N samples, and each of the delay blocks 611 to 612 delays the data x(n) by one sample and may be implemented using a storage register or memory, for example. The output of each of the filters $H_0(z)$ 631 to filter $H_{N-1}(Z)$ 633 is provided to N-point FFT block 640, which outputs corresponding DFTs $X_0$ to $X_{N-1}$ for the discrete signal x(n).

FIG. 7 is a functional block diagram representing a streaming filter bank of a spectral analyzer, showing a more efficient implementation of FIG. 6, in which one filter structure is used while K filter coefficients rotate per multiplier, which may be referred to as streaming filter bank based FFT analysis.

Referring to FIG. 7, an input signal is received at a sampling rate of $F_S$. The input signal is provided consecutively to a series of buffers having corresponding delays, indicated by buffers 731 to 733. Buffer 731 delays the input signal by a first delay, buffer 732 delays the delayed signal output by buffer 731 by a second delay, and the (N-1)th buffer 733 delays the delayed signal output by the previous buffer (e.g., buffer 732) by an N-1)th delay. In addition, multiplier 721 multiplies the input signal by multiple taps corresponding to filter coefficients $h_0, h_1 \ldots h_{N-1}$. Multiplier 722 multiplies the delayed signal output by buffer 731 by multiple taps corresponding to filter coefficients $h_K$, $h_{K+1} \ldots h_{2N-1}$. Multiplier 723 multiplies the delayed signal output by buffer 732 by multiple taps corresponding to filter coefficients $h_{2K}, h_{2K+1} \ldots h_{3N-1}$. Multiplier 724 multiplies the delayed signal output by buffer 733 by multiple taps corresponding to filter coefficients $h_{(N-1)K}, h_{(N-1)K+1} \ldots h_{sN-1}$. The outputs of the multipliers 721 to 724 are added (or summed) by adder 740 to provide I data of IQ data of the input signal. Meanwhile, a corresponding process is performed on the Q data of the IQ data from the input signal, as indicated by block 760. The I data and the Q data are provided to N-point FFT block 750, which outputs frequency domain IQ data from the input signal as polyphase DFT of the discrete signal x(n).

FIG. 3 and FIG. 7 may be combined to implement a general filter bank based CZT algorithm, as shown in FIG. 8. More particularly, FIG. 8 is a functional block diagram representing a streaming filter bank based CZT algorithm with double window length, which combines the windowed FFT based CZT algorithm shown in FIG. 5 and the streaming filter bank shown in FIG. 7. The streaming filter bank based CZT algorithm has double the window length due to implementation of two polyphase filters, discussed below.

Referring to FIG. 8, a filter circuit includes multipliers 815 and 825, two polyphase filter blocks 810 and 820, buffer 830 and adder 840. A CZT circuit includes multipliers 215, 325 and 235, function blocks 510, 326 and 230, FFT block 321 and IFFT block 322, discussed above with reference to FIGS. 4 and 5.

The multiplier 815 is configured to determine the product of each of 2N samples of discrete signal $x_n$ (where n=0, 1, . . . , 2N-1) and polyphase filter block 810, which implements filter coefficients h(0 . . . N-1). The multiplier 825 is configured to determine the product of N samples of the discrete signal $x_n$ delayed by the buffer 830, and polyphase filter block 820, which implements filter coefficients h(N . . . 2 N). The products output by the multipliers 815 and 825 are added together by adder 840 and output to the multiplier 215. The multiplier 215 determines the product of the output of the adder 840 and the function block 510, which is provided to the FFT block 321. The remainder of the CZT processing is performed as discussed above with regard to FIGS. 3 to 5.

FIG. 9 is a functional block diagram representing the streaming filter bank based CZT algorithm shown in FIG. 8, where the pre-multiplier of the CZT circuit is combined with the filter coefficients in the filter circuit. In other words, FIG. 9 depicts the functions of function block 510 of the CZT circuit and the filter block 810 of the filter circuit combined into combined function block 910, which then performs function h(0 . . . N-1)·(A$^{-n}$W$^n$)/2. Likewise, the functions of function block 510 of the CZT circuit and the filter block 820 of the filter circuit are combined into combined function block 920, which then performs function h(N . . . 2N)·(A$^{-n}$W$^n$)/2. Each of the combined functions is divided by two to account for the two filter blocks 810 and 820 (and twice the window length).

FIG. 10 is a functional block diagram representing a general streaming filter bank based CZT algorithm for a filter of length sN, where s is an integer greater and equal to one. In comparison, FIG. 9 is the specific case in which s=1. When s=1, it is the classical windowed case, and when all filter coefficients h are equal to one, the structure reduces to the basic CZT algorithm in FIG. 3. Without loss of generality, the structure depicted in FIG. 10 may be used to evaluate the DFT for the discrete signal $x_n$, indicated by $X_k$, which lie on circular or spiral contours beginning at any arbitrary point in the z-plane by simply modifying the $A_0$ and $W_0$ parameters, as indicated in FIG. 11, which have possible applications beyond the classical DFT based spectral analysis.

The generalized filter bank based CZT algorithm chirp-z equations become Equations (18) and (19):

$$X_k = \sum_{s=0}^{S-1}\sum_{n=0}^{N-1} h(n-sN)x(n-sN)e^{-\frac{j2\pi kn}{N}} \quad (18)$$

$$X_k = W^{k^2/2} \sum_{n=0}^{N-1} y(n)v(k-n) \quad (19)$$

where, $$y(n) = \sum_{s=0}^{S-1}\sum_{n=0}^{N-1} h(n-sN)x(n-sN)\left(A^{-n}W^{n^2/2}\right)/(s+1),$$

and $v(n) = W^{n^2/2}$ $$X_k = W^{k^2/2} \cdot IFFT[FFT(y(n)) \cdot FFT(v(n))]$$

More particularly, as shown in FIG. 10, the CZT pre-multiplier of FIG. 8 is combined in the filter circuit, which is generalized to include s+1 filter blocks, indicated representative combined filter blocks 1010, 1020 and 1030, which are representative polyphase filters. Thus, the combined filter block 1010 performs function h(0 . . . N-1)·(A$^{-n}$W$^n$)/(s+1), the combined filter block 1020 performs function h(N . . . 2N)·(A$^{-n}$W$^n$)/(s+1), and the combined filter block 1030 performs function h(N . . . sN)·(A$^{-n}$W$^n$)/(s+1). The multiplier 1015 receives sN samples of discrete signal $x_n$ (where n=0, 1, . . . , sN-1), and is configured to determine the product of the sampled discrete signal $x_n$ and combined filter block 1010. The multiplier 1025 is configured to determine the product of N samples of the discrete signal $x_n$, delayed by buffer 1031, and combined filter block 1020. The multiplier 1035 is configured to determine the product of N samples of the discrete signal $x_n$, delayed by all preceding buffers, indicated by representative buffers 1031 and 1032, and combined filter block 1030. The products output by the multipliers 1015, 1025 and 1035 are added together by adder 1040 and output to the FFT block 321. The remainder of the CZT processing is performed as discussed above to provide $X_k$ (where k=0, 1, . . . , M−1), which is the DFT for the discrete signal $x_n$.

Accordingly, the various embodiments enable a zoom display of an arbitrary narrow bandwidth of the sampled signal, e.g., selected by the user, while at the same time, enable features to be identified at enhanced resolution across the entire bandwidth of the sampled signal. Referring back to FIG. 6, for example, the output signals $X_k$ of the filter bank represent independent frequency selective channels determined by the shape of the polyphase filter that decomposes the entire bandwidth into N uniformly spaced channels. With the structure of the embodiment disclosed in FIG. 10, the system can also be described as a channelizing system with arbitrary bandwidth, producing N channels between arbitrary start and stop frequencies, not just the entire bandwidth.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A method of performing real-time spectral analysis of a non-stationary signal by a spectrum analyzer, the method comprising:
    sampling the non-stationary signal using an analog to digital converter, with a short observation window having a length short enough to approximate a stationary signal, to provide an initial set of sampled data;
    buffering, in one or more buffers, the initial set of sampled data to obtain a plurality of buffered sets of sampled data, the plurality of buffered sets of sampled data emulating data sampled using a longer observation window based on the non-stationary signal sampled through the short observation window, improving overall spectral resolution of the non-stationary signal;
    filtering the initial set of sampled data and the plurality of buffered sets of sampled data, using a corresponding plurality of filter responses, to obtain a plurality of filtered sets of sampled data;
    performing a chirp-z-transform (CZT) of the plurality of filtered sets of sampled data to provide a set of discrete Fourier transforms (DFT) coefficients; and
    reconstructing a total signal spectrum of the non-stationary signal using the set of DFT coefficients; and
    displaying the reconstructed total signal spectrum of the non-stationary input signal on a spectrum analyzer display in real-time.

2. The method of claim 1, wherein the plurality of filter responses are derived from a single filter.

3. The method of claim 2, wherein buffering the initial set of sampled data comprises delaying the initial set of sampled data using a plurality of buffers, each buffer corresponding to one of the plurality of buffered sets of sampled data.

4. The method of claim 1, wherein each of the initial set of sampled data and the plurality of buffered sets of sampled data corresponds to a limited spectrum portion of the total signal spectrum of the non-stationary signal.

5. The method of claim 1, wherein spectral resolution is improved due to a relatively larger input data set, comprising the initial set of sampled data and the plurality of buffered sets of sampled data, mitigating frequency resolution error.

6. The method of claim 1, wherein performing the CZT of the plurality of filtered sets of sampled data comprises:

adding the plurality of filtered sets of sampled data;
performing a fast Fourier transform (FFT) on the added filtered sets of sampled data;
filtering the FFT sets of sampled data using an FFT of a complex chirp function;
performing an inverse FFT (IFFT) on the filtered FFT sets of sampled data; and
filtering the IFFT sets of sampled data using another complex chirp function to provide the set of DFT coefficients.

7. The method of claim 6, wherein filtering the initial set of sampled data comprises:
    multiplying a filter coefficient for each sampled data point in the initial set of sampled data by a quotient of a complex number, based on a sampling frequency of the initial set of sampled data, and the number of initial and buffered sets of sampled data.

8. The method of claim 7, wherein filtering each of the plurality of buffered sets of sampled data comprises:
    multiplying a filter coefficient for each sampled data point in each of the buffered sets of sampled data by the quotient of the complex number and the number of initial and buffered sets of sampled data.

9. The method of claim 1, wherein reconstructing the total signal spectrum of the non-stationary signal comprises evaluating the set of DFT coefficients in a z-plane, the set of DFT coefficients lying on circular or spiral contours beginning at an arbitrary point in the z-plane.

10. The method of claim 1, wherein a duration of the observation window is less than a period of intermittence or transience of the non-stationary signal.

11. A spectrum analyzer comprising:
    an analog to digital converter (ADC) for receiving and sampling a non-stationary signal from a device under test (DUT), using a short observation window to approximate a stationary signal, to provide sampled signals;
    a processing device programmed to:
        filter the sampled signals using a first polyphase filter to provide first filtered sampled signals;
        delay the sampled signals to provide delayed sampled signals;
        filter the delayed sampled signals using a second polyphase filter to provide second filtered sampled signals;
        perform chirp-z-transforms (CZTs) of the first and second filtered sampled signals to provide discrete Fourier transforms (DFT) coefficients; and
        reconstruct a total signal spectrum of the non-stationary signal using the DFT coefficients; and
    a display configured to display the reconstructed total signal spectrum of the input signal in real-time.

12. The spectrum analyzer of claim 11, wherein the processing device is further programmed to add the first and second filtered sampled signals before performing the CZTs.

13. The spectrum analyzer of claim 11, wherein performing the CZTs comprises:
    performing a fast Fourier transform(FFT) on the added first and second sampled signals;
    filtering the FFT sampled signals using an FFT of a complex chirp function;
    performing an inverse FFT (IFFT) on the filtered FFT sampled signals; and
    filtering the IFFT sampled signals using another complex chirp function to provide the set of DFT coefficients.

14. The spectrum analyzer of claim 11, wherein the first and second polyphase filters have corresponding first and second filter responses which are derived from a single filter.

15. The spectrum analyzer of claim 14, wherein reconstructing the total signal spectrum of the non-stationary signal comprises evaluating the DFT coefficients in a z-plane, the DFT coefficients lying on circular or spiral contours beginning at an arbitrary point in the z-plane.

16. The spectrum analyzer of claim 11, wherein a duration of the short observation window is less than a period of intermittence or transience, such that signal statistics of the non-stationary signal remain stationary throughout the observation window.

17. The spectrum analyzer of claim 11, wherein displaying the reconstructed total signal spectrum of the non-stationary signal enables zooming to an arbitrary narrow bandwidth of the sampled non-stationary signal, and further enables display at enhanced resolution across an entire bandwidth of the sampled non-stationary signal.

18. A spectral analyzer comprising:
- an analog to digital converter (ADC) configured to receive and sample a non-stationary input signal from a device under test (DUT), and to provide first sampled data, wherein the sampling is performed using a short observation window having a length short enough to approximate a stationary signal;
- a filter bank comprising a first polyphase filter configured to filter the first sampled data to provide first filtered sampled data, a second polyphase filter configured to filter second sampled data to provide second filtered sampled data, and a third polyphase filter configured to filter third sampled data to provide third filtered sampled data;
- a first buffer configured to delay the first sampled data by a first delay to provide the second sampled data;
- a second buffer configured to delay the second filtered sampled data by a second delay to provide the third sampled data;
- an adder configured to add the first, second and third filtered sampled data to provide summed filtered data;
- a chirp-z-transform (CZT) circuit configured to perform a CZT on the summed filtered data to provide frequency domain samples corresponding to the input signal, the frequency domain samples enabling reconstruction of a total signal spectrum of the input signal; and
- a display configured to display the reconstructed total signal spectrum of the input signal in real-time.

19. The spectrum analyzer of claim 18, wherein the CZT circuit comprises:
- a fast Fourier transform (FFT) circuit configured to perform an FFT operation on the summed filtered data to provide an FFT signal;
- an FFT filter configured to filter the FFT signal to provide a filtered FFT signal;
- an inverse FFT (IFFT) circuit configured to perform an IFFT operation on the filtered FFT signal to provide an IFFT signal; and
- a IFFT filter configured to filter the IFFT signal to provide the frequency domain samples.

20. The spectrum analyzer of claim 18, wherein the first, second and third filtered sampled data emulate data sampled using a longer observation window based on the non-stationary signal sampled through the short observation window, thereby improving overall spectral resolution of the non-stationary signal.

* * * * *